US006487698B1

(12) United States Patent
Andreev et al.

(10) Patent No.: US 6,487,698 B1
(45) Date of Patent: Nov. 26, 2002

(54) PROCESS, APPARATUS AND PROGRAM FOR TRANSFORMING PROGRAM LANGUAGE DESCRIPTION OF AN IC TO AN RTL DESCRIPTION

(75) Inventors: Alexander E. Andreev, San Jose, CA (US); Ranko Scepanovic, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 15 days.

(21) Appl. No.: 09/849,919

(22) Filed: May 4, 2001

(51) Int. Cl.$^7$ .............................. G06F 17/50; G06F 9/45
(52) U.S. Cl. ........................ 716/3; 716/18; 717/136
(58) Field of Search ...................... 716/3, 18; 717/136

(56) References Cited

U.S. PATENT DOCUMENTS 5,293,631 A * 3/1994 Rau et al. .................... 717/154
5,870,585 A * 2/1999 Stapleton .................... 703/15

OTHER PUBLICATIONS

V. Turchin, The Concept of a Supercompiler, ACM Transactions on Programming Languages and Systems, Jul., 1986, pp. 292–325.*

* cited by examiner

Primary Examiner—Vuthe Siek
Assistant Examiner—A. M. Thompson
(74) Attorney, Agent, or Firm—Westman, Champlin & Kelly

(57) ABSTRACT

An RTL description, such as a Verilog description, of an integrated circuit is derived from a C/C++ description by defining the integrated circuit as a generalized multiplexer having outputs and two groups of input variables $X_1, X_2, \ldots, X_s$ and $Y_1, Y_2, \ldots, Y_n$ in which each variable $X_1, X_2, \ldots, X_s$, is fixed and no output depends on more than one variable of $Y_1, Y_2, \ldots, Y_n$. An output vector is constructed by Exclusive-OR operations to find an index j for $UU1=(BIT(0,j), BIT(1,j), \ldots, BIT(K-1),j))$. The Verilog description of the circuit is a function of the solution of the output vector, or a constant.

20 Claims, 1 Drawing Sheet

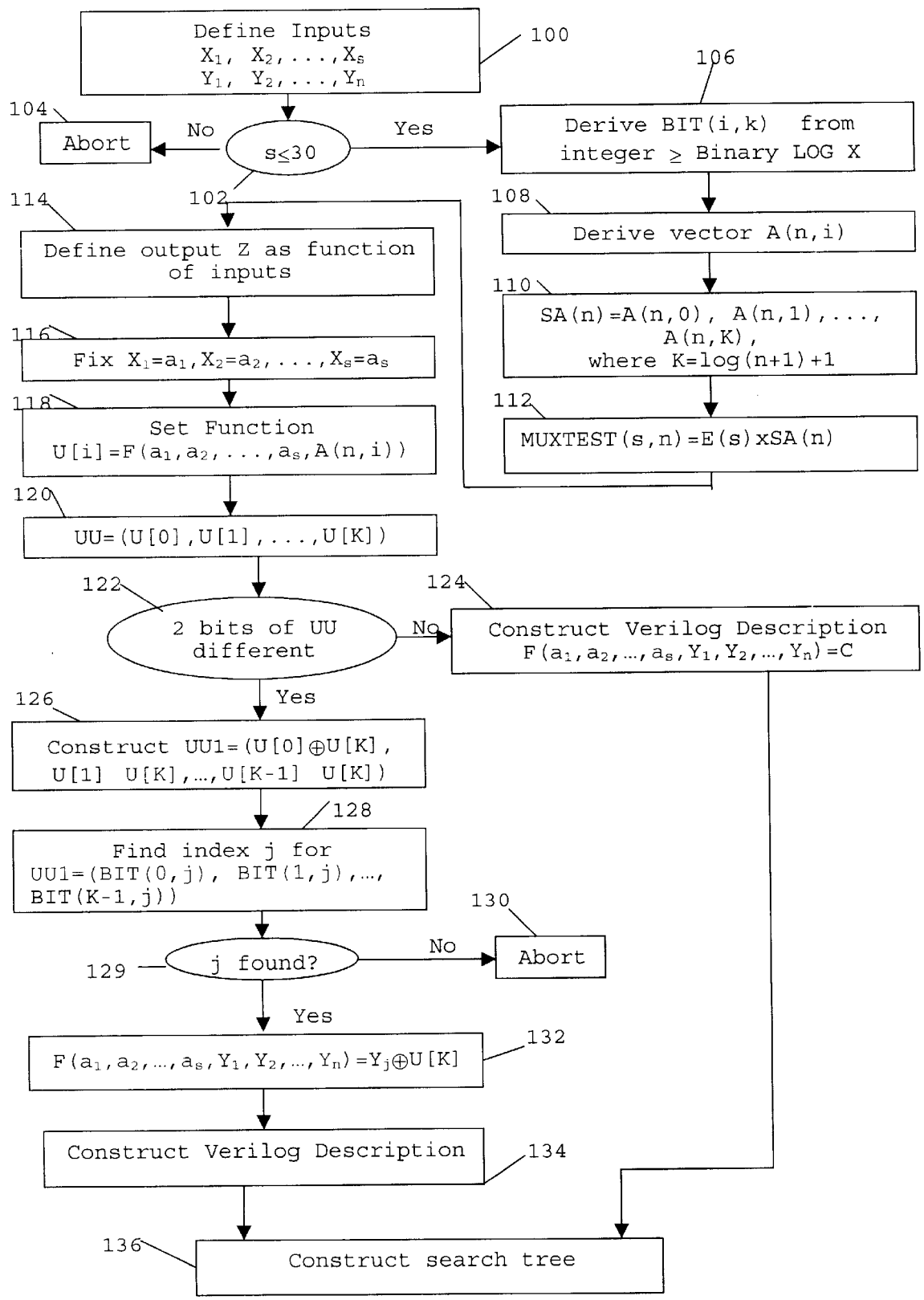

PROCESS, APPARATUS AND PROGRAM FOR TRANSFORMING PROGRAM LANGUAGE DESCRIPTION OF AN IC TO AN RTL DESCRIPTION

FIELD OF THE INVENTION

This invention relates to integrated circuit design, and particularly to compilers for developing a hardware description language of a circuit.

BACKGROUND OF THE INVENTION

Integrated circuits (ICs) are often designed at a level of abstraction known as the registered transfer level (RTL), which is typically implemented in a hardware description language, such as Verilog HDL or VHDL. Verilog HDL is a hardware description language administered by the Institute of Electrical and Electronics Engineers (IEEE). At the RTL level of abstraction, the IC design is specified by functionally describing operations performed on data as they flow between circuit inputs, outputs and clocked registers. The Verilog HDL is both machine and human readable and is commonly used for development, verification, synthesis and testing of integrated circuit designs.

Most IC foundries require an RTL code describing the IC circuit to be fabricated. More particularly, the RTL code can be synthesized by the foundry to generate a gate-level description (netlist) for the IC. Synthesizing is performed using a technology library to map the RTL code into technology-dependent gate-level netlists, or mapped netlists. The RTL code is not technology dependent; the RTL code does not specify exact gates or logic devices to implement the design. The mapped netlist is technology dependent.

Many IC designers create IC designs using programming languages, such as C and C++. Code written in these languages is not easily synthesized or mapped to a given technology. Where an IC design is functionally described in C or C++, complex parsing is required to generate an RTL code, such as a Verilog HDL description of the circuit. Transformation from C/C++ to Verilog HDL is usually performed manually, meaning that process is highly labor-intensive. There is a need, therefore, for a compiler that transforms functional circuit models from languages such as C or C++, to an RTL description, such as Verilog HDL, so that the circuit design may be mapped, verified, modified, synthesized and tested.

SUMMARY OF THE INVENTION

In accordance with one aspect of the present invention, an integrated circuit functional description is transformed to an RTL description by modeling the integrated circuit as a generalized multiplexer. The multiplexer is defined by two groups of input variables $X_1, X_2, \ldots, X_s$ and $Y_1, Y_2, \ldots, Y_n$, and a group of outputs. Each input variable of the first group, $X_1, X_2, \ldots, X_s$, is fixed as $X_1 = a_1, X_2 = a_2, \ldots, X_s = a_s$, where $a_1, a_2, \ldots, a_s$ are fixed terms. No output depends on more than one variable of the second group. Output U[i] is defined, represented by $F(a_1, a_2, \ldots, a_s, BIT(i,1), BIT(i,2), BIT(i,3), \ldots, BIT(i,n))$, where i is a bit position of a number k. An output vector is constructed as $UU1 = U[0] \oplus U[K], U[0] \oplus U[K], \ldots, U[0] \oplus U[K]$. If an index j exists for which $UU1 = (BIT(0,j), BIT(1,j), \ldots, BIT(K-1),j))$, an RTL description of the integrated circuit is constructed as $$F(a_1, a_{i-1}, 0, X_{i+1}, \ldots, X_s, Y_1, Y_2, \ldots, Y_n) \wedge (\neg X_i) \text{ OR } F(a_1, a_{i-1}, 1, X_{i+1}, \ldots, X_s, Y_1, Y_2, \ldots, Y_n) \wedge X_i.$$

Another aspect of the present invention is the provision of computer readable program that is embedded in a computer usable medium. The computer readable program includes program code that causes a computer to form an RTL description of an integrated circuit.

BRIEF DESCRIPTION OF THE DRAWING

The sole FIGURE is a flow chart illustrating the process of developing an RTL description, such as a Verilog HDL description, of an integrated circuit in accordance with the present invention.

DETAILED DESCRIPTION OF THE PREFERRED EMBODIMENTS

In accordance with the present invention, a functional description of an integrated circuit in a programming language such as C or C++ is transformed to an RTL code in a hardware description language, such as Verilog HDL, so that the circuit may be verified, modified, synthesized and tested as part of the fabrication of the integrated circuit. The integrated circuit is considered a "black box" defined by its inputs and outputs. The invention treats the integrated circuit as a form of a generalized multiplexer that has two groups of input variables, $X_1, X_2, \ldots, X_s$ and $Y_1, Y_2, \ldots, Y_n$, where the values of the variables of the first group, $X_1, X_2, \ldots, X_s$, are fixed and s is small, and where no circuit output, Z, depends on more than one variable of the second group. While these limitations may appear to be restrictive, they are in fact common to a large number of circuits.

The sole FIGURE is a flow chart of the process of developing a Verilog HDL description of the integrated circuit from a functional model in C/C++. At step 100, circuit inputs of the integrated circuit are defined as two groups of inputs $X_1, X_2, \ldots, X_s$ and $Y_1, Y_2, \ldots, Y_n$ of a generalized multiplexer. At step 102 the value of s, which is the number of terms of $X_1, X_2, \ldots, X_s$, is examined to determine whether s exceeds some predetermined number, such as 30. If s is greater than the predetermined number, the process is aborted at step 104. LOG(X) is the closest upper integer to the binary logarithm of each respective input $X_1, X_2, \ldots, X_s$.

If s is smaller than or equal to the predetermined number, the values of BITs(i,k) are derived at step 106. BIT(i,k) is the value of bit i in the binary representation of arbitrary number k. If the i-th bit is at a position greater than the position of upper bit of k, BIT(i,k) is set to 0. At step 108, a set of vectors A(n,i) is derived as (BIT(i,1), BIT(i,2), BIT(i,3), ..., BIT(i,n)), where n is the number n of terms in the input group $Y_1, Y_2, \ldots, Y_n$. Each vector A(n,i) comprises the BITs(i, k) for a respective bit position i in all k binary representations. For example, if there are three X input terms whose binary representations of k are 1001, 0101 and 0011, and if there are five Y input terms (n=5), there are five vectors A(n, i) expressed as "000", "100", "010", "000" and "111" (the initial vector "000" is derived from the 0 binary values at the implicit fifth most significant position of each k).

At step 110, a vector SA(n) is derived from the collection of vectors A(n, i) as {A(n,0), A(n,1), ..., A(n,K)}, where K=LOG(n+1)+1. At step 112, a set of vectors MUXTEST (s,n) is defined as MUXTEST(s, n)=E(s)×SA(n), where E(s) is the set of all possible Boolean vectors of length s.

At step 114, decoding is performed for each circuit output Z, where Z is a function of $X_1, X_2, \ldots, X_s, Y_1, Y_2, \ldots, Y_n$:

$$Z = F(X_1, X_2, \ldots, X_s, Y_1, Y_2, \ldots, Y_n).$$

Next, the function of the circuit is computed on all vectors of the set MUXTEST(s,n). This is accomplished at steps 116–132. At step 116, the value of each variable $X_1, X_2, \ldots, X_s$ is fixed to a constant, $$X_1 = a_1, X_2 = a_2, \ldots, X_s = a_s.$$

At step 118, each output, U[i], is represented as $$U[i] = F(a_1, a_2, \ldots, a_s, A(n, i))$$
$$= F(a_1, a_2, \ldots, a_s, BIT(i, 1), BIT(i, 2), BIT(i, 3), \ldots, BIT(i, n)).$$

The output vector, UU, is identified at step 120 as (U[0],U[1], ... U[K]). At step 122, a determination is made to find if all bits of vector UU are a constant C, or if two bits are different for any values of $Y_1, Y_2, \ldots, Y_n$. If all bits of vector UU are a constant, then a Verilog description of the circuit is constructed at step 124 as $$F(a_1, a_2, \ldots, a_s, Y_1, Y_2, \ldots, Y_n) = C.$$

If vector UU has two different bits, vector UU1 is constructed at step 126 as $$UU1 = (U[0] \oplus U[K], U[1] \oplus U[K], \ldots, U[K-1] \oplus U[K]),$$

(each $U[i] \oplus U[K]$ is an Exclusive-OR operation). An index j is located at step 128 for which $$UU1 = (BIT(0,j), BIT(1,j), \ldots, BIT(K-1,j)).$$

At step 129, if an index j is not found, the assumption that the circuit fits the restrictions is not true, and the process is aborted at step 130. If, at step 129, index j is found, then at step 132, $$F(a_1, a_2, \ldots, a_s, Y_1, Y_2, \ldots, Y_n) = Yj \oplus U[K].$$

and a Verilog description of the circuit is constructed at step 134 as $$F(a_1, \ldots a_{t-1}, X_s, Y_1, Y_2, \ldots, Y_n) = F(a_1, a_{t-1}, 0, X_{t+1} \ldots, X_s, Y_1, Y_2, \ldots, Y_n) \wedge (\neg X_t) \text{ OR } F(a_1, a_{t-1}, 1, X_{t+1} \ldots, X_s, Y_1, Y_2, \ldots, Y_n) \wedge X_t,$$

where t is an integer based on s ($\wedge$ represents an AND function and $\neg$ represents a NOT function). For example if s=5, when t=(s−1)=4 there are eight possible expressions for F based on all possible 3-bit combinations for $a_1 \ldots a_{t-1}$. The expressions are processed to reduce t to (s−2)=3 to create four possible expressions based on all possible 2-bit combinations for $a_1 \ldots a_{t-1}$. When t=2, there are two expressions for all combinations of $a_1$ (0 and 1), and when t=1 the single expression for F can be solved.

At step 136, a binary search tree organizes the circuit descriptions. Vertices in the lowest level of the binary search tree are arranged in decreasing order of t. Those lowest level vertices having the same functionality are merged. Where t=s, merging is performed by direct comparison, and since each function depends on no more than one variable, the merge function is simple. Vertices of hierarchy levels are merged if they have the same child vertices after merging on the lower level. The resulting search tree represents the RTL code in a hardware description language for the integrated circuit. The resulting RTL code may be mapped to generate a technology-dependent mapped netlist of the integrated circuit.

Although the present invention has been described with reference to preferred embodiments, workers skilled in the art will recognize that changes may be made in form and detail without departing from the spirit and scope of the invention.

What is claimed is:

1. A process of transforming a program language description of an integrated circuit into an RTL description of the integrated circuit, the program language description functionally describing the integrated circuit in terms of inputs and outputs, the process comprising steps of:
   a) defining the integrated circuit as a generalized multiplexer having two groups of input variables $X_1, X_2, \ldots, X_s$ and $Y_1, Y_2, \ldots, Y_n$, and a plurality of outputs Z such that no output depends on more than one variable of the group consisting of $Y_1, Y_2, \ldots, Y_n$;
   b) fixing each variable $X_1, X_2, \ldots, X_s$ as $X_1 = a_1, X_2 = a_2, \ldots, X_s = a_s$, where $a_1, a_2, \ldots, a_s$ are fixed terms;
   c) constructing an output vector UU as a function of the input variables $X_1, X_2, \ldots, X_s$ and $Y_1, Y_2, \ldots, Y_n$ and the plurality of outputs Z;
   d) if output vector UU has two different bits, constructing a vector UU1 as (BIT(0,j), BIT(1,j), ..., BIT(K−1,j)), where K is based on the number of Y input terms; and
   e) if an index j exists in vector UU1, constructing an RTL description of the integrated circuit as either $$F(a_1, a_{t-1}, 0, X_{t+1} \ldots, X_s, Y_1, Y_2, \ldots, Y_n) \wedge (\neg X_t)$$

OR $$F(a_1, a_{t-1}, 1, X_{t+1} \ldots, X_s, Y_1, Y_2, \ldots, Y_n) \wedge (X_t).$$

2. The process of claim 1, wherein step (c) comprises steps of:
   c1) deriving a set of vectors, A(n,i) based on bit values BIT(i,k) of bits of a binary representation of an integer k;
   c2) computing a set of output functions, U[i], of the integrated circuit as a function of fixed terms $a_1, a_2, \ldots, a_s$, the set of vectors A(n,i), the number n of Y input terms and a set of Boolean operators E(s) having a length s, where s is the number of X input terms; and
   c3) constructing the output vector UU from the output functions U[i].

3. The process of claim 2, wherein step (c2) comprises steps of:
   c2a) deriving a vector, SA(n), based on the vectors A(n,i) and the number n of Y input terms;
   c2b) deriving a set of test vectors, MUXTEST(s,n), based on the vector SA(n) and the set of Boolean operators E(s); and
   c2c) computing the set of output functions, U[i], of the integrated circuit for each test vector MUXTEST(s,n) as a function of fixed terms $a_1, a_2, \ldots, a_s$ and the set of vectors A(n, i).

4. The process of claim 2, wherein step (d) comprises steps of:
   d1) constructing vector UU1 as $U[0] \oplus U[K]$, $U[1] \oplus U[K], \ldots, U[K-1] \oplus U[K]$; and
   d2) identifying index j for which UU1 is BIT(0,j), BIT(1,j), ..., BIT(K−1,j).

5. The process of claim 1, further includes steps of:
   f) identifying whether all of the bits of output vector UU are a constant C; and
   g) if the bits of vector UU are the constant C, setting the RTL description as $F(a_1, a_2, \ldots, a_s, Y_1, Y_2, \ldots, Y_n) = C$.

6. The process of claim 5, further including the step of:
   h) if the bits of vector UU are not the constant C and index j does not exist, aborting the construction of the RTL description.

7. The process of claim 1, further including the step of:
f) if index j does not exist, aborting the construction of the RTL description.

8. The process of claim 1, wherein the number of X terms is not larger than 30.

9. The process of claim 1, further including the step of:
(f) constructing a binary tree based on the RTL description.

10. The process of claim 1, wherein step (d) comprises steps of:
d1) constructing vector UU1 as $U[0] \oplus U[K]$, $U[1] \oplus U[K]$, ..., $U[K-1] \oplus U[K]$; and
d2) identifying an index j for which UU1 is $BIT(0,j)$, $BIT(1,j)$, ..., $BIT(K-1,j)$.

11. A computer usable medium having a computer readable program embodied therein for addressing data to cause a computer to transform a program language description of an integrated circuit to a hardware description language, the program language description functionally describing the integrated circuit in terms of inputs and outputs, the computer readable program in the computer usable medium comprising:
first computer readable program code for causing the computer to define the integrated circuit as a multiplexer having two groups of input variables $X_1$, $X_2$, ..., $X_s$ and $Y_1$, $Y_2$, ..., $Y_n$, and a plurality of outputs such that no output depends on more than one variable of the group consisting of $Y_1, Y_2, \ldots, Y_n$;
second computer readable program code for causing the computer to fix each variable $X_1, X_2, \ldots, X_s$, as $X_1=a_1$, $X_2=a_2, \ldots, X_s=a_s$;
third computer readable program code for causing the computer to construct an output vector UU as a function of the input variables $X_1, X_2, \ldots, X_s$ and $Y_1$, $Y_2, \ldots, Y_n$ and a plurality of outputs Z;
fourth computer readable program code for causing the computer to identify if vector UU contains two different bits;
fifth computer readable program code responsive to an identification that vector UU contains two different bits for causing the computer to construct a vector UU1 as $(BIT(0,j), BIT(1,j), \ldots, BIT(K-1,j)$, where K is based on the number of Y input terms; and
sixth computer readable program code for causing the computer to construct an RTL description of the multiplexer as $$F(a_1, a_{t-1}, 0, X_{t+1} \ldots, X_s, Y_1, Y_2, \ldots, Y_n) \wedge (\neg X_t)$$

OR $$F(a_1, a_{t-1}, 1, X_{t+1} \ldots, X_s, Y_1, Y_2, \ldots, Y_n) \wedge (X_t).$$

12. The computer usable medium of claim 11, wherein the third computer readable program code includes:
seventh computer readable program code for causing the computer to derive a set of vectors, $A(n,i)$ based on bit values $BIT(i,k)$ of bits of a binary representation of an integer k;
eighth computer readable program code for causing the computer to compute a set of output functions, $U[i]$, of the integrated circuit as a function of fixed terms $a_1$, $a_2, \ldots, a_s$, the set of vectors $A(n,i)$, the number n of Y input terms and a set of Boolean operators E(s) having a length s, where s is the number of X input terms; and
ninth computer readable program code for causing the computer to construct the output vector UU from the output functions $U[i]$.

13. The computer usable medium of claim 12, wherein the eighth computer readable program code includes:
computer readable program code for causing the computer to derive a vector, $SA(n)$, based on the vectors $A(n,i)$ and the number n of Y input terms;
computer readable program code for causing the computer to derive a set of test vectors, $MUXTEST(s,n)$, based on the vector $SA(n)$ and the set of Boolean operators E(s); and
computer readable program code for causing the computer to compute the set of output functions, $U[i]$, of the integrated circuit for each test vector $MUXTEST(s,n)$ as a function of fixed terms $a_1, a_2, \ldots, a_s$ and the set of vectors $A(n,i)$.

14. The computer usable medium of claim 11, wherein the fifth computer readable program code includes:
computer readable program code for causing the computer to construct vector UU1 as $U[0] \oplus U[K]$, $U[1] \oplus U[K]$, ..., $U[K-1] \oplus U[K]$; and
computer readable program code for causing the computer to identify index j for which UU1 is $BIT(0,j)$, $BIT(1,j)$, ..., $BIT(K-1,j)$.

15. The computer usable medium of claim 11, further including:
computer readable program code for causing the computer to identify whether all of the bits of output vector UU are a constant C; and
computer readable program code responsive to an identification that all bits of the output vector UU are the constant C for causing the computer to set the RTL description as $F(a_1, a_2, \ldots, a_s, Y_1, Y_2, \ldots, Y_n)=C$.

16. An apparatus for transforming a program language description of an integrated circuit to a hardware description language, the program language description functionally describing the integrated circuit in terms of inputs and outputs, the apparatus comprising:
defining means defining the integrated circuit as a multiplexer having two groups of input variables $X_1$, $X_2, \ldots, X_s$ and $Y_1, Y_2, \ldots, Y_n$, and a plurality of outputs Z such that no output depends on more than one variable of the group consisting of $Y_1, Y_2, \ldots, Y_n$;
means for fixing each variable $X_1, X_2, \ldots, X_s$, as $X_1=a_1$, $X_2=a_2, \ldots, X_s=a_s$;
first vector means for constructing an output vector UU as a function of the input variables $X_1, X_2, \ldots, X_s$ and $Y_1, Y_2, \ldots, Y_n$ and a plurality of outputs Z;
identifying means responsive to the first vector means for identifying if vector UU contains two different bits;
second vector means responsive to the identifying means for constructing a vector UU1 as $(BIT(0,j), BIT(1,j), \ldots, BIT(K-1,j))$, where K is based on the number of Y input terms; and
output means for constructing an RTL description of the multiplexer as $$F(a_1, a_{t-1}, 0, X_{t+1} \ldots, X_s, Y_1, Y_2, \ldots, Y_n) \wedge (\neg X_t)$$

OR $$F(a_1, a_{t-1}, 1, X_{t+1} \ldots, X_s, Y_1, Y_2, \ldots, Y_n) \wedge (X_t).$$

17. The apparatus of claim 16, wherein the first vector means comprises:
first calculating means for computing a binary representation of each $LOG(X)$;
third vector means responsive to the first calculating means for deriving a set of vectors, $A(n,i)$ based on bit values $BIT(i,k)$ of bits of the binary representation of an integer k;

second calculating means for computing a set of output functions, U[i], of the integrated circuit as a function of fixed terms $a_1, a_2, \ldots, a_s$, the set of vectors A(n,i), the number n of Y input terms and a set of Boolean operators E(s) having a length s, where s is the number of X input terms; and fourth vector means for constructing the output vector UU from the output functions U[i].

18. The apparatus of claim 17, wherein the second calculating means comprises:

fifth vector means for deriving a vector, SA(n), based on the vectors A(n,i) and the number n of Y input terms;

sixth vector means for deriving a set of test vectors, MUXTEST(s,n), based on the vector SA(n) and the set of Boolean operators E(s); and third calculating means for computing the set of output functions, U[i], of the integrated circuit for each test vector MUXTEST(s,n) as a function of fixed terms $a_1, a_2, \ldots, a_s$ and the set of vectors A(n,i).

19. The apparatus of claim 16, wherein the second vector means comprises:

third vector means for constructing vector UU1 as U[0]⊕U[K], U[1]⊕U[K], . . . , U[K−1]⊕U[K]; and second identifying means for identifying index j for which UU1 is BIT(0,j), BIT(1,j), . . . , BIT(K−1,j).

20. The apparatus of claim 16, further including:

second identifying means for identifying whether all of the bits of output vector UU are a constant C; and second output means responsive to the third identifying means for setting the RTL description as $F(a_1, a_2, \ldots, a_s, Y_1, Y_2, \ldots, Y_n)=C$.

* * * * *